(12) United States Patent
Anderson et al.

(10) Patent No.: US 6,744,246 B2
(45) Date of Patent: Jun. 1, 2004

(54) ELECTRICAL PROBE

(75) Inventors: Ian P. Anderson, Beaverton, OR (US); Brian G. Russell, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/112,231

(22) Filed: Mar. 29, 2002

(65) Prior Publication Data

US 2003/0184276 A1 Oct. 2, 2003

(51) Int. Cl.[7] .............................................. G01R 31/02
(52) U.S. Cl. ...................................... 324/72.5; 324/754
(58) Field of Search ....................... 250/208.2; 324/75.5, 324/754, 758, 761, 762

(56) References Cited

U.S. PATENT DOCUMENTS

| | | | | |
|---|---|---|---|---|
| 6,023,171 A | * | 2/2000 | Boyette et al. | ............. 324/754 |
| 6,118,287 A | * | 9/2000 | Boll et al. | ................... 324/754 |
| 6,332,270 B2 | * | 12/2001 | Beaman et al. | ................ 29/844 |
| 6,466,000 B1 | * | 10/2002 | Nightingale | ................ 324/72.5 |

* cited by examiner

Primary Examiner—N. Le
Assistant Examiner—Walter Benson
(74) Attorney, Agent, or Firm—William K. Bucher (57) ABSTRACT

An electrical probe for a flying leadset of a logic analyzer probe has coaxially aligned internal elements enclosed in an insulating cover. The probe has an electrically conductive contact having contact fingers extending in one direction from a support member and a contact member extending in the opposite direction. A sleeve abuts the contact member and receive a center conductor of a conductive cable that is secured in the contact member. The insulating cover has a contact cover portion and a over-mold portion that are chemically bonded together. The contact fingers are positioned in the contact cover and the over-mold portion encapsulates the rest of the probe. The contact fingers are aligned parallel with one side of a square aperture formed in the contact cover. A resistive element may be interposed between the contact member and the sleeve.

23 Claims, 5 Drawing Sheets

ELECTRICAL PROBE

BACKGROUND OF THE INVENTION

The present invention relates generally to electrical probes and more particularly to an electrical probe for flying leadset logic analyzer probes that accommodates two millimeter pin spacing.

Figure 1:
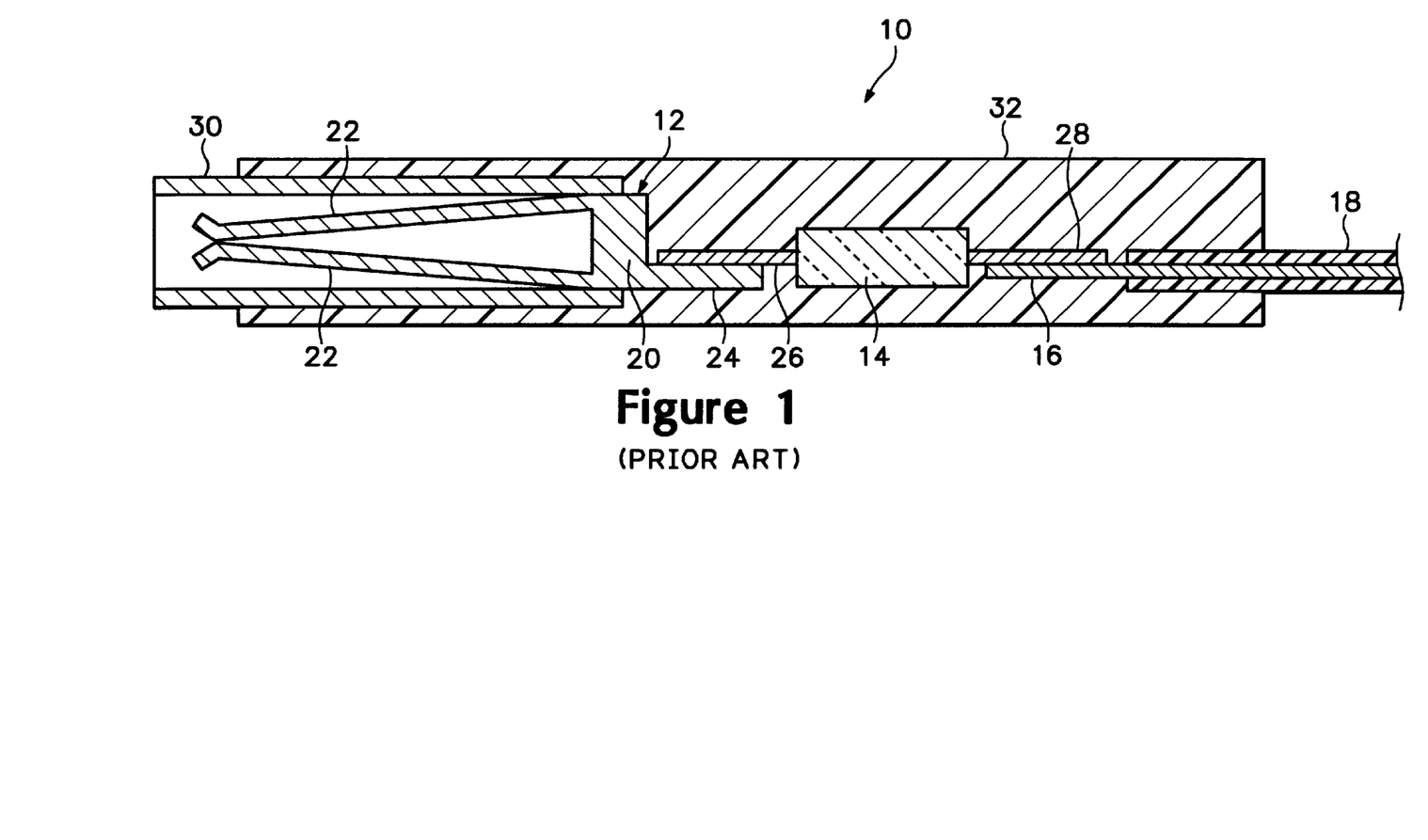
FIG. 1 is a cross-section view of an existing electrical probe for a flying leadset logic analyzer probe.

Flying leadsets are logic analyzer probe extensions that allow probing of individual square pin contact of a device under test, such a microprocessor mother board. A leadset consists of a group of electrical probes having contacts that plug onto the square pin contacts mounted on the device under test. Each of the electrical probes of the leadset are electrically coupled to a general-purpose probe of a logic analyzer via a conductive cable. FIG. 1 is a cross-sectional view of an electrical probe 10 for a flying leadset manufactured and sold by Tektronix, Inc., Beaverton, Oreg. The electrical probe 10 has an electrical contact 12 electrically coupled to a resistor 14, which in turn is electrically connected to the center conductor 16 of a conductive cable 18. The electrical contact 12 has a circular central portion 20 with inwardly angled contact fingers 22 extending in one direction from the circular central portion and a flat portion 24 extending from circular central portion in the opposite direction. One lead 26 of the resistor 14 is soldered to the flat potion 24 of the electrical contact and the other resistor lead 28 is soldered to the center conductor 16 of the cable 18. A metal tube 30 is positioned over the contact fingers 22 of the electrical contact 12. One end of the tube 30 extends past the end of the contact fingers 22 and the other end closely fits on the circular central portion 20. A thermoplastic cover 32 is injection molded over the assembled elements with a portion of the metal tube 30 at the distal end of the tube left exposed.

The metal tube serves two purposes: 1) to protect the contact fingers from damage and 2) act as a thermoplastic dam to prevent the injection molded thermoplastic from encapsulating the contact fingers. A drawback to using the metal tube as the thermoplastic dam is that the distal end of the tube is exposed which allows for the possibility of shorts across the square pin contacts or pads of the device under test. A solution to this problem is to substitute a pre-molded thermoplastic cover that is slid down over the assembled elements with the one end of the cover extending down to the end of the metal tube.

Current leadset designs offer users the ability to probe individual pins having centerline-to-centerline pin spacings as close as 0.10 inches. Though this pin spacing is widely used in the electronics industry, closer pin spacings are beginning to become more prevalent. Connectors with two millimeter centerline-to-centerline pin spacings are now being used with compact PCI bus structures. At this spacing, users of the current leadset electrical probes are forced to probe every other pin contact, or bend the pin contacts at allow the electrical probes of the leadset to be grouped side by side.

The present leadset electrical probe design allows the probe to be inserted onto square pin contacts in any orientation. This means that a 0.025 inch square pin contact, which is the prevalent type of square pin contact used in the electronics industry, could deflect the contact fingers of the electrical contact as much as a 0.032 inch diameter round pin. The deflection of the contact fingers is proportional to the stresses in the contact. Excessive deflection of the fingers causes the stress to exceed the elastic limit of the material, thus permanently deforming the fingers and decreasing the pin retention force. decreases the pin retention force of the fingers. Moreover, square pin contacts as small as 0.015 inches are being proposed by the electronic industry. Attempting to make contact on a smaller pin with contact fingers that have been deformed will result in little or no contact force, which can cause intermittent electrical contact between the smaller square pin contacts and the contact fingers.

What is needed is an electrical probe for flying leadsets that allows connection to pin contacts at two millimeter spacing. The electrical probe should also limit the deflection of the contact fingers of the electrical probe to allow reliable electrical connection to various sizes of pin contacts. The electrical probe should also provide protection for the electrical contact without the use of the previously used metal tube.

SUMMARY OF THE INVENTION

Accordingly, the present invention is to an electrical probe for a flying leadset of a logic analyzer probe useable with two millimeter spacing contact pins. The electrical probe has coaxially aligned internal elements enclosed in an insulating cover. The electrical probe is configurable as a ground contact probe and a signal probe. The electrical probe has an electrically conductive contact having first and second inwardly angled contact fingers axially aligned with and extending from a support member. The contact fingers have opposing interior surfaces defining a slit there between. The support member has at least a first keying surface formed thereon. The electrically conductive contact further has an axially aligned contact member that extends from the support member in a direction opposite the first and second inwardly angled contact fingers. In the preferred embodiment of the electrical probe, the contact fingers, support member and the contact member are integrally formed.

The ground contact electrical probe has an electrically conductive sleeve axially aligned with and disposed adjacent to the contact member. The sleeve has a bore extending therethough that receives a central conductor of a conductive cable. The central conductor extends through the bore and is secured in the contact member by soldering, crimping or the like of the contact member. The signal electrical probe has a resistive element, such as a resistor, axially aligned with and disposed adjacent to the contact member. The resistive element has electrically conductive contacts extending from opposing ends of the element with one of the electrically conductive contacts secured in the contact member. The electrically conductive sleeve is axially aligned with and disposed adjacent to the resistive element with the other electrically conductive contact of the resistive element extending into the sleeve. The central conductor of the conductive cable also extends into the sleeve. The resistive element contact and the cable central conductor are secured in the sleeve by solder, crimping or the like of the sleeve.

The insulating cover has a contact cover portion and a over-mold portion that are chemically bonded together during overmolding. The contact cover portion has an open end and a closed end with a bore extending part way through the contact cover portion from the open end. The interior of the bore has at least a first interior complementary keying surface to the support member keying surface extending from the open end of the contact cover portion. The open end may be formed with an irregular surface to provide greater surface area for chemical bonding. In particular, the open end of the contact cover portion may be formed with a dove tail recess to both increase surface area for bonding and provide mechanical coupling. The closed end of the contact cover portion has a square aperture formed therein having interior walls intersecting the bore. The keying surface of the support member is positioned relative to the slit between the inwardly angled contact fingers and the complementary keying surface of the bore is positioned relative to one of the interior walls of the square aperture to align the slit parallel with one of the interior walls of the square aperture.

The contact fingers are positioned in the bore of the contact cover portion with the interior complementary keying surface of the bore aligned with and engaging the keying surface of the support member. The open end of the contact cover portion closely fitting over a portion of the support member with the over-mold portion abutting the contact cover portion and encapsulating the other portion of the support member, the resistive element when present, the electrically conductive sleeve and a portion of the conductive cable extending from the sleeve. In the preferred embodiment of the invention, the insulating cover is formed of a thermoplastic material having a maximum side-to-side dimension of up to two millimeters with the square aperture having a maximum side-to-side dimension of up to 0.025 inches.

The objects, advantages and novel features of the present invention are apparent from the following detailed description when read in conjunction with the appended claims and attached drawings.

DETAILED DESCRIPTION OF THE PREFERRED EMBODIMENT

Figure 2:
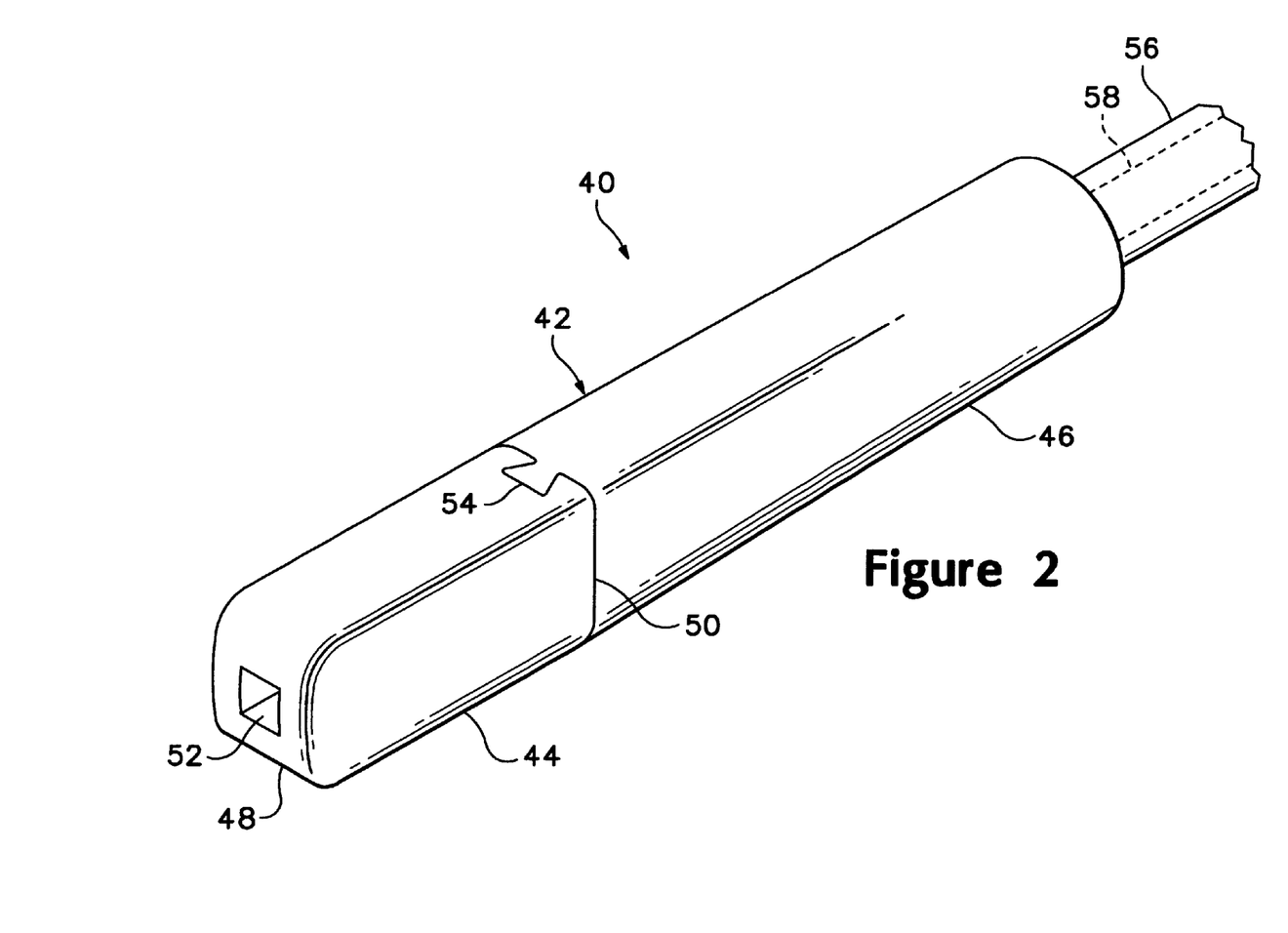
FIG. 2 is a perspective view of the electrical probe for a flying leadset according to the present invention.

Referring to FIG. 2, there is shown a perspective view of the electrical probe 40 for a flying leadset. The electrical probe has an substantially square insulating cover 42 having a contact cover portion 44 and at one end of the probe an over-molded portion 46 encapsulating probe elements at the other end of the probe. The insulating cover is formed of a thermoplastic material, such as ABS plastic or the like. The contact cover portion 44 has a closed end 48 and an open end 50. A square aperture 52 is formed in the closed end 48 of the contact cover portion 44 for receiving contact pins mounted on a device under test. The open end 50 of the contact cover portion 44 is preferably formed with an irregular end surface to provide greater contact surface area between the cover portion 44 and the over-molded portion 46. In the preferred embodiment, the irregular surface takes the form of a dovetail recess 54, which also provides mechanical coupling. A conductive cable 56 having a central conductor 58 extends from the opposite end of the probe and is partially encapsulated by the over-molded portion 46 of the insulating cover 42. In the preferred embodiment, the electrical probe 40 has a maximum side-to-side dimension of approximately two millimeters and the square aperture has a maximum side-to-side dimension of approximately 0.025 inches.

Figure 3:
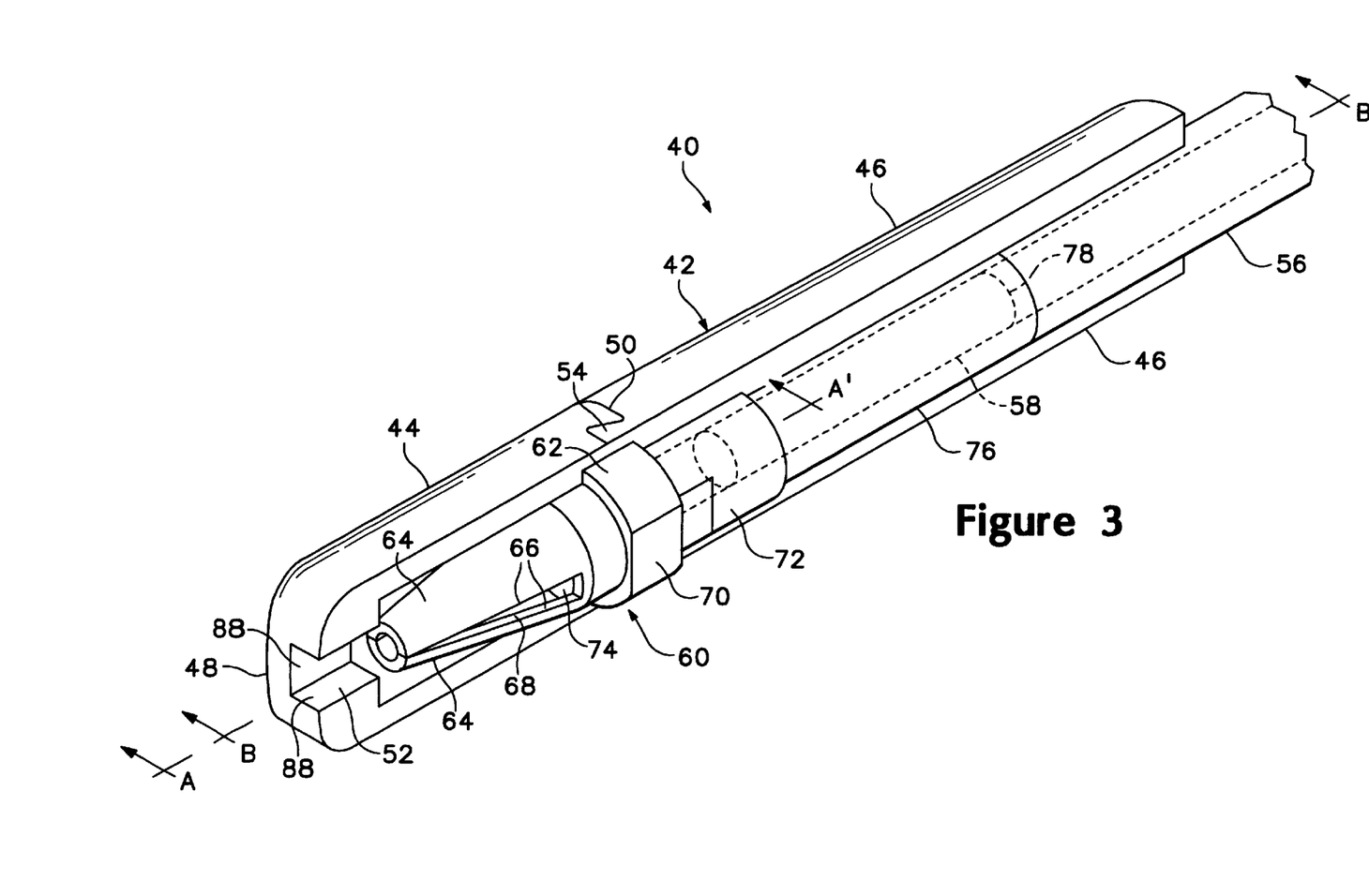
FIG. 3 is a partially exposed view of the elements for the ground contact probe configuration of the electrical probe for a flying leadset according to the present invention.

Referring to FIG. 3, there is shown partially exposed view of the elements for the ground contact probe configuration of the electrical probe 40. The electrical probe 40 has an electrically conductive contact 60 formed of an electrically conductive material, such as heat treated beryllium-copper that is gold plated. The electrically conductive contact 60 has a support member 62 from which extends inwardly angled first and second contact fingers 64 axially aligned with the support member 62. The contact fingers 64 have interior surfaces 66 defining a slit 68 between the contacts. The support member 62 has a generally cylindrical surface with at least one of the surfaces having a keying surface 70. In the preferred embodiment, keying surface 70 is a flat surface that is parallel with or orthogonal to the slit 68 between the contact fingers 64 and can include orthogonal flat surfaces formed on opposite sides of the support member 62. The keying surface 70 may have one parallel flat surface and one orthogonal flat surface formed on the support member 62. Alternately, the keying surface 70 has one or more of a key and a notch formed on the support member 62. A contact member 72 is axially aligned with the support member 62 and extends from the support member in the opposite direction from the contact fingers 64. A horizontal bore 74 is preferably formed through the contact member 72 and the support member 62 with the bore 74 being exposed in the slit 68 between the contact fingers 64. Alternately, the horizontal bore 74 may extend through the contact member 72 with a vertically formed bore extending from the surface of the contact member 72 that intersects the horizontal bore 72. An electrically conductive sleeve 76 is axially aligned with the contact member 72 with one end of the sleeve disposed adjacent to the contact member 72. The sleeve 72 has a bore 78 formed therethough that receives the central conductor 58 of the conductive cable 56. A portion of the central conductor 58 is secured within the contact member 72 using a solder paste. The through bore 74 is provided in the electrically conductive contact 60 to allow degassing of solder paste. A vertically formed bore that intersects the horizontal bore 74 would perform the same function. Alternately, the contact member 72 may be crimped onto the central conductor 58 of the conductive cable 56. In this alternative configuration, there is no need for degassing of the solder paste so the horizontal bore need only extend through the contact member 72 without having an intersecting vertical bore through the contact member 72 or having a through bore in the contact member 72.

Figure 4:
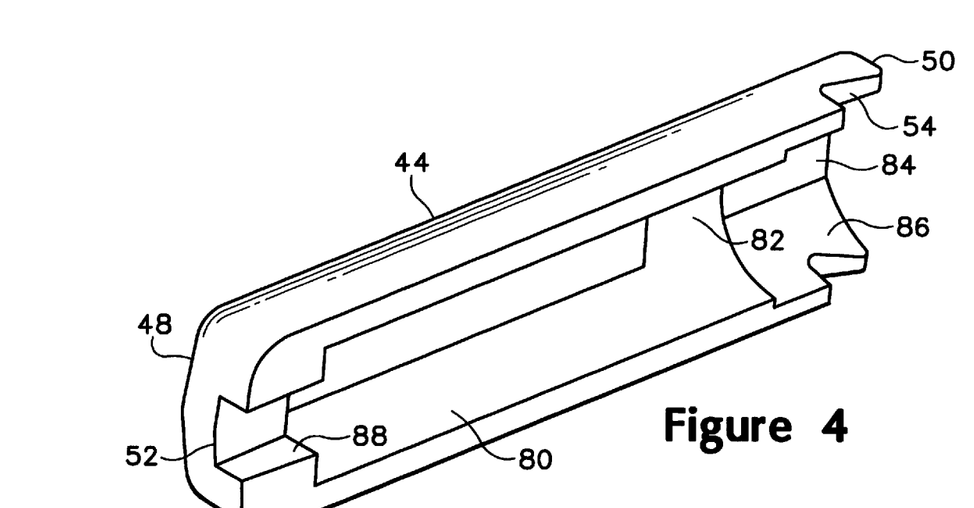
FIG. 4 is a cross-sectional view along line A–A' of the contact cover portion of the insulating cover of the electrical probe for a flying leadset according to the present invention.

FIG. 4 is a cross-sectional view along line A–A' of the contact cover portion 44. A bore 80 extends part way through the contact cover portion from the open end 50. The interior surface 82 of the bore 80 adjacent to the end face 50 conforms to the surface of the electrically conductive contact support 62 member with the interior surface having at least a first complementary keying surface 84 to the support member keying surface extending into the bore 80 from the open end 50. In the preferred embodiment, the interior surface 82 of the bore 80 has opposing complementary flay keying engaging the flat keying surface of the support member 62. Alternately, the complementary keying surface 84 has one or more of a key and a notch formed on the interior surface 82 of the bore 80. The surfaces 86 adjacent to the keying surface or surfaces 84 are concave shaped to conform to the rounded surfaces of the support member 62. The square aperture 52 at the closed end 48 of the contact cover portion 44 has interior walls 88 that intersect the bore 80. The keying surface 70 of the support member 62 is positioned relative to the slit 68 between the inwardly angled contact fingers 64 and the complementary keying surface 84 of the bore 80 is positioned relative to one of the interior walls 88 of the square aperture 52 to align the slit 68 parallel with one of the interior walls 88 of the square aperture 52. The relationship of the keying surfaces 70 and 84 with the slit 68 and the interior walls 88 of the square aperture 52 assures that the contact fingers 64 are aligned parallel with one of the interior walls 88 of the square aperture 52.

Figure 5:
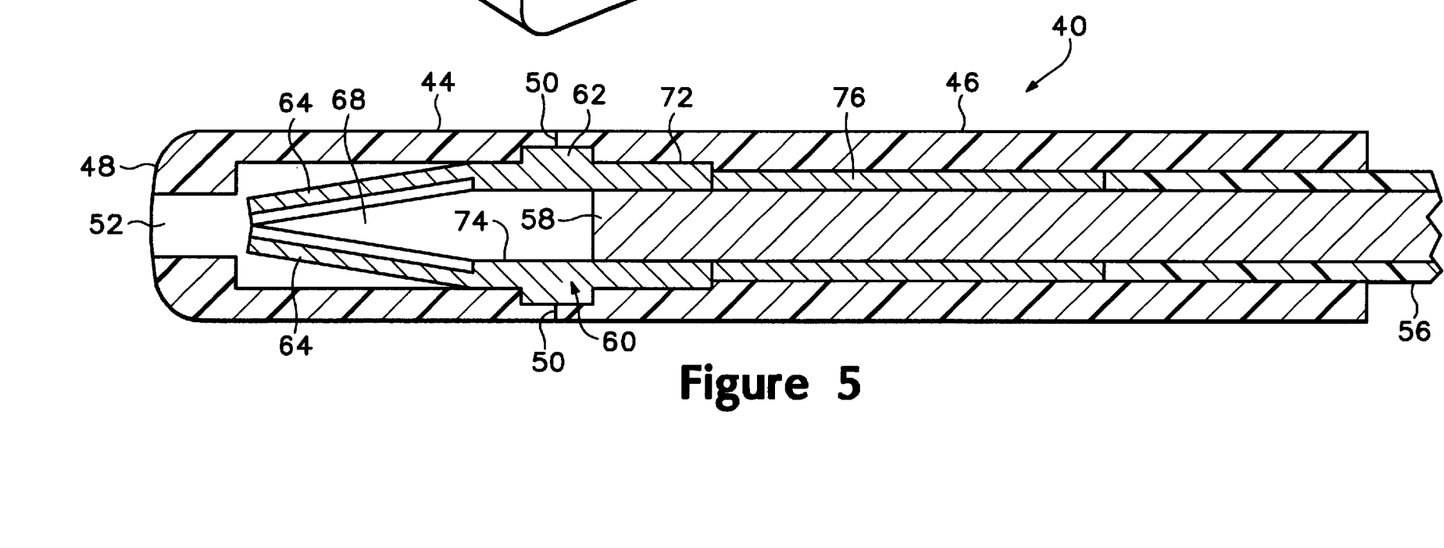
FIG. 5 is a cross-sectional view along line B–B' of the ground contact probe configuration of the electrical probe for a flying leadset according to the present invention.

FIG. 5 is a cross-sectional view along line B–B' of the ground contact probe configuration of the electrical probe 40. Like elements from previous drawing are labeled the same. The central conductor 58 of the conductive cable 56 is inserted through the conductive sleeve 76 with the end of the conductor positioned and secured in the contact member 72 of the electrically conductive contact 60. The sleeve 76 is abutted against the end of the contact member and the contact cover portion 44 is positioned on the electrically conductive contact 60 with the contact fingers 64 disposed in the bore 80 of the contact cover portion 44. The open end 50 of the contact cover portion 44 closely fits onto the support member 62 with the complementary keying surface or surfaces 84 of the bore 80 engaging the keying surface or surfaces 70 on the support member 62 and the cylindrical surfaces 82 engaging the rounded surfaces on the support member 62. The contact cover portion 44 act as a thermoplastic dam to prevent the thermoplastic of the injection molded thermoplastic of the over-molded portion from encapsulating the contact fingers 64. The probe 40 is inserted into an injection molding machine where the over-molded portion 46 of the insulating cover 42 is added to the probe.

Figure 6:
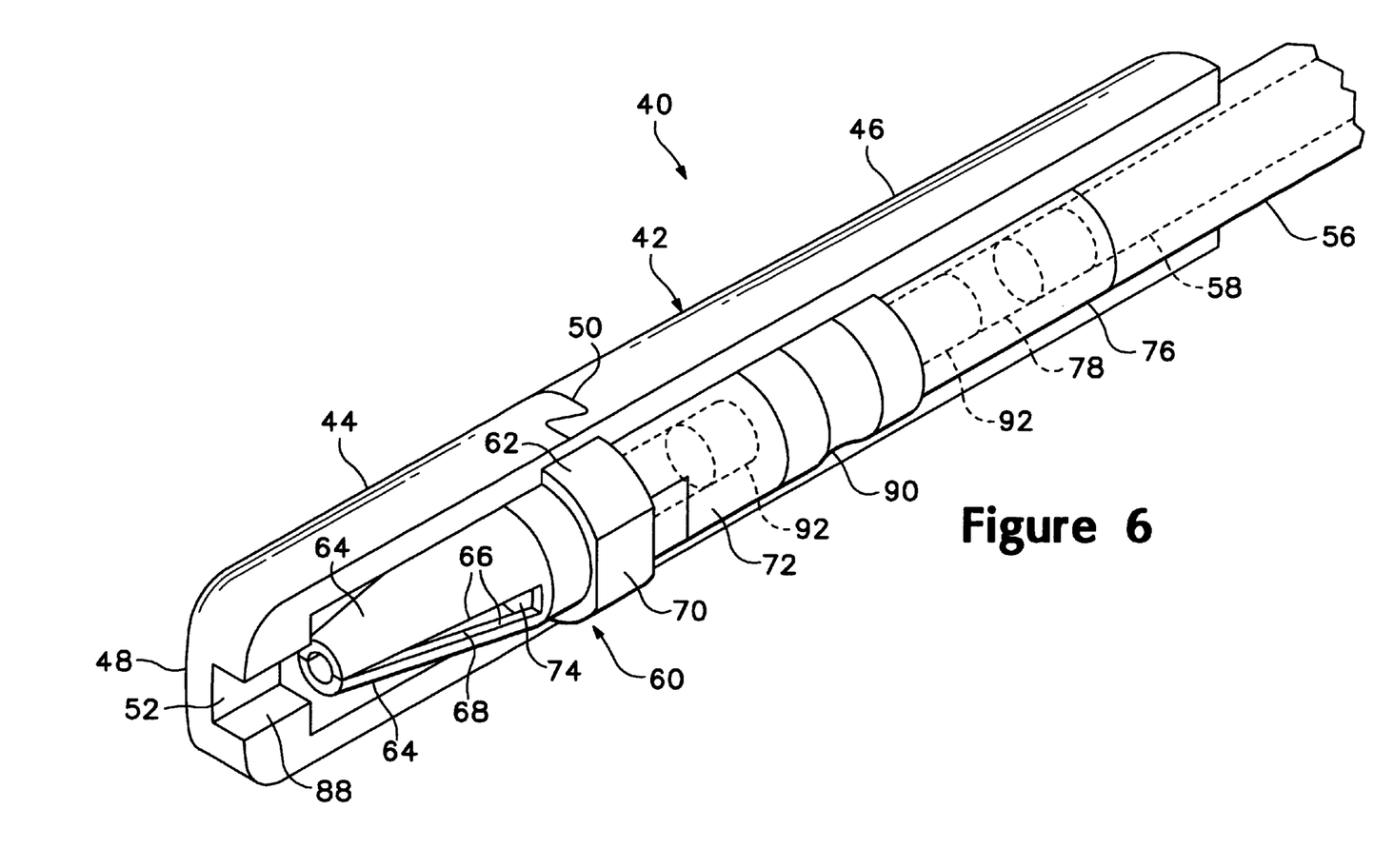
FIG. 6 is a partially exposed view of the elements for the signal probe configuration of the electrical probe for a flying leadset according to the present invention.

FIG. 6 is a partially exposed view of the elements for the signal probe configuration of the electrical probe 40. Like elements from previous drawing are labeled the same. The signal probe configuration interposes a resistive element 90, such as a resistor, between the contact member 72 of the electrically conductive element 60 and the electrically conductive sleeve 76. Electrically conductive contacts 92 extend from opposing ends of resistive element 90 with one of the electrically conductive contacts 92 positioned and secured in the contact member 72. The other electrically conductive contact 92 is inserted into one end of the electrically conductive sleeve 76. The central conductor 58 of the conductive cable 56 is inserted into the other end of the sleeve 76. The sleeve 76 is preferably crimped onto the electrically conductive contact 92 and the central conductor 58 to electrically couple and secure the central conductor 58 and electrically conductive contact 92 in the sleeve 76. Alternately, the central conductor 58 and the electrically conductive contact 92 may be soldered in the sleeve 76. The length of the electrically conductive sleeve 76 is shortened by the length of the resistive element body 90 so that the overall length of the signal probe configuration is the same as the ground contact configuration.

The contact cover portion 44 of the insulating cover 42 is positioned over the electrically conductive contact 60 as previously described with the contact fingers aligned parallel to one of the sides of the square aperture 52 and the open end of the cover portion closely fitting the support member 62 of the electrically conductive contact 60. The probe 40 is inserted into an injection molding machine where the over-molded portion 46 of the insulating cover 42 is added to the probe.

An electrical probe for a flying leadset of a logic analyzer probe has been described having coaxially aligned internal elements enclosed in an insulating cover that is useable with two millimeter spacing contact pins. The electrical probe has an electrically conductive contact with inwardly angled contact fingers axially extending from a support member. A contact member extends from the support member in a direction opposite the inwardly angled contact fingers and receives a central conductor of a conductive cable. The central conductor is inserted through an electrically conductive sleeve that abuts the contact member. A resistive element is interposed between the contact member and the sleeve for a signal probe configuration of the electrical probe. The insulating cover has a contact cover portion having a bore extending part way through the contact cover portion that receives the contact fingers. The bore has at least a first interior complementary keying surface that engages a corresponding keying surface on the support member to align the contact fingers parallel with one of the interior walls of a square aperture formed in the other end of the contact cover portion. The open end of the contact cover portion closely fits over a portion of the support member with the over-mold portion abutting the contact cover portion and encapsulating the other portion of the support member, the resistive element when present, the electrically conductive sleeve and a portion of the conductive cable extending from the sleeve. In the preferred embodiment of the invention, the insulating cover is formed from a thermoplastic material having a maximum side-to-side dimension of up to two millimeters with the square aperture having a maximum side-to-side dimension of up to 0.025 inches.

It will be obvious to those having skill in the art that many changes may be made to the details of the above-described embodiments of this invention without departing from the underlying principles thereof. The scope of the present invention should, therefore, be determined only by the following claims.

What is claimed is:

1. An electrical probe comprising:
    an electrically conductive contact having first and second inwardly angled contact fingers axially aligned with and extending from a support member with the first and second contact fingers having opposing interior surfaces defining a slit there between, the support member having at least a first keying surface formed thereon and a contact member extending from the support member and axially aligned with and extending in a direction opposite the first and second inwardly angled contact fingers;
    an electrically conductive sleeve having a bore extending therethough axially aligned with and disposed adjacent to the contact member of the support member and having a central conductor of a conductive cable extending through the bore and secured in the contact member;
    an insulating cover having a contact cover portion and a over-mold portion with the contact cover portion having an open end and a closed end with a bore extending part way through the contact cover portion from the open end and having at least a first interior complementary keying surface to the support member keying surface extending from the open end, and the closed end having a square aperture formed therein having interior walls intersecting the bore with the keying surface of the support member being positioned relative to the slit between the inwardly angled contact fingers and the complementary keying surface of the bore being positioned relative to one of the interior walls of the square aperture to align the slit parallel with one of the interior walls of the square aperture; and the first and second inwardly angled contact fingers being positioned in the bore of the contact cover portion with the interior complementary keying surface of the bore aligned with and engaging the keying surface of the support member, the open end of the contact cover portion closely fitting over a first portion of the support member and the over-mold portion abutting the contact cover portion and encapsulating the other portion of the support member, the electrically conductive sleeve and a portion of the conductive cable extending from the sleeve.

2. The electrical probe as recited in claim 1 wherein the inwardly angle contact fingers, the support member and the contact member of the electrically conductive contact are integrally formed.

3. The electrical probe as recited in claim 1 wherein the insulating cover has a maximum side-to-side dimension of up to 2 millimeters.

4. The electrical probe as recited in claim 1 wherein the square aperture has a maximum side-to-side dimension of up to 0.025 inches.

5. The electrical probe as recited in claim 1 wherein the keying surface and the complementary keying surfaces are flat surfaces.

6. The electrical probe as recited in claim 1 the insulating cover is formed form a thermoplastic material.

7. The electrical probe as recited in claim 1 wherein the over-mold portion of the insulating cover is chemically bonded to the contact cover portion.

8. The electrical probe as recited in claim 7 wherein the open end of the contact cover portion further comprises an irregular surface for providing a larger surface are for chemical bonding.

9. The electrical probe as recited in claim 8 wherein the irregular surface comprises a dovetail notch.

10. An electrical probe comprising:

an electrically conductive contact having first and second inwardly angled contact fingers axially aligned with and extending from a support member with the first and second contact fingers having opposing interior surfaces defining a slit there between, the support member having at least a first keying surface formed thereon and a contact member extending from the support member and axially aligned with and extending in a direction opposite the first and second inwardly angled contact fingers;

a resistive element having electrically conductive contacts extending from opposing ends of the element with the resistive element axially aligned with and disposed adjacent to the contact member of the support member with one of the electrically conductive contacts of the resistive element secured in the contact member;

an electrically conductive sleeve having a bore extending therethough axially aligned with and disposed adjacent to the resistive element with the other of the electrically conductive contacts of the resistive element secured in one end of the electrically conductive sleeve;

a conductive cable having a central conductor surrounded by an outer insulating layer with a portion of the outer insulating cover removed to expose the central conductor, the exposed central conductor secured in the other end of the electrically conductive sleeve;

an insulating cover formed of a thermoplastic material having a contact cover portion and a over-mold portion with the contact cover portion having an open end and a closed end with a bore extending part way through the contact cover portion from the open end and having at least a first interior complementary keying surface to the support member keying surface extending from the open end, and the closed end having a square aperture formed therein having interior walls intersecting the bore with the keying surface of the support member being positioned relative to the slit between the inwardly angled contact fingers and the complementary keying surface of the bore being positioned relative to one of the interior walls of the square aperture to align the slit parallel with one of the interior walls of the square aperture; and the first and second inwardly angled contact fingers being positioned in the bore of the contact cover portion with the interior complementary keying surface of the bore aligned with and engaging the keying surface of the support member, the open end of the contact cover portion closely fitting over a first portion of the support member and the over-mold portion abutting the contact cover portion and encapsulating the other portion of the support member, the electrically conductive sleeve and a portion of the conductive cable extending from the sleeve.

11. The electrical probe as recited in claim 10 wherein the inwardly angle contact fingers, the support member and the contact member of the electrically conductive contact are integrally formed.

12. The electrical probe as recited in claim 10 wherein the square aperture has a maximum side-to-side dimension of up to 0.025 inches.

13. The electrical probe as recited in claim 10 wherein the insulating cover has a maximum side-to-side dimension of up to 2 millimeters.

14. The electrical probe as recited in claim 10 wherein the keying surface and the complementary keying surfaces are flat surfaces.

15. The electrical probe as recited in claim 10 the insulating cover is formed form a thermoplastic material.

16. The electrical probe as recited in claim 15 wherein the over-mold portion of the insulating cover is chemically bonded to the contact cover portion.

17. The electrical probe as recited in claim 10 wherein the open end of the contact cover portion further comprises an irregular surface for providing a larger surface are for chemical bonding.

18. The electrical probe as recited in claim 17 wherein the irregular surface comprises a dovetail notch.

19. An electrical probe comprising:

an electrically conductive contact having first and second inwardly angled contact fingers axially aligned with and extending from a support member with the first and second contact fingers having opposing interior surfaces defining a slit there between, the support member having at least a first keying surface formed thereon and a contact member axially aligned with and extending in a direction opposite the first and second inwardly angled contact fingers;

a resistive element having electrically conductive contacts extending from opposing ends of the element with the resistive element axially aligned with and disposed adjacent to the contact member of the support member with one of the electrically conductive contacts of the resistive element secured in the contact member;

an electrically conductive sleeve having a bore extending therethough axially aligned with and disposed adjacent to the resistive element with the other of the electrically conductive contacts of the resistive element secured in one end of the electrically conductive sleeve;

a conductive cable having a central conductor surrounded by an outer insulating layer with a portion of the outer insulating cover removed to expose the central conductor, the exposed central conductor secured in the other end of the electrically conductive sleeve;

an insulating cover having a contact cover portion and a over-mold portion with the insulating cover having a maximum side-to-side dimension of up to two millimeters, the contact cover portion having an open end and a closed end with a bore extending part way through the contact cover portion from the open end and having at least a first interior complementary keying surface to the support member keying surface extending from the open end, and the closed end having a square aperture formed therein having interior walls intersecting the bore with the square aperture having a maximum side-to-side dimension of up to 0.025 inches and the keying surface of the support member being positioned relative to the slit between the inwardly angled contact fingers and the complementary keying surface of the bore being positioned relative to one of the interior walls of the square aperture to align the slit parallel with one of the interior walls of the square aperture; and the first and second inwardly angled contact fingers being positioned in the bore of the contact cover portion with the interior complementary keying surface of the bore aligned with and engaging the keying surface of the support member, the open end of the contact cover portion closely fitting over a first portion of the support member and the over-mold portion chemically bonded to the contact cover portion and encapsulating the other portion of the support member, the electrically conductive sleeve and a portion of the conductive cable extending from the sleeve.

20. The electrical probe as recited in claim 19 wherein the inwardly angle contact fingers, the support member and the contact member of the electrically conductive contact are integrally formed.

21. The electrical probe as recited in claim 19 wherein the keying surface and the complementary keying surfaces are flat surfaces.

22. The electrical probe as recited in claim 19 wherein the open end of the contact cover portion further comprises an irregular surface for providing a larger surface area for chemical bonding.

23. The electrical probe as recited in claim 22 wherein the irregular surface comprises a dovetail notch.

* * * * *